(12) United States Patent
Li et al.

(10) Patent No.: US 9,897,863 B2
(45) Date of Patent: Feb. 20, 2018

(54) ARRAY SUBSTRATE, DISPLAY PANEL AND DISPLAY APPARATUS HAVING RECESSES ON DATA LINES OR GATE LINES

(71) Applicant: BOE TECHNOLOGY GROUP CO., LTD., Beijing (CN)

(72) Inventors: Wenbo Li, Beijing (CN); Pan Li, Beijing (CN); Jianbo Xian, Beijing (CN); Hongfei Cheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,303

(22) PCT Filed: Apr. 10, 2015

(86) PCT No.: PCT/CN2015/076293
§ 371 (c)(1),
(2) Date: Aug. 20, 2015

(87) PCT Pub. No.: WO2016/065851
PCT Pub. Date: May 6, 2016

(65) Prior Publication Data
US 2016/0266431 A1  Sep. 15, 2016

(30) Foreign Application Priority Data
Oct. 27, 2014  (CN) .................. 2014 2 0628360 U

(51) Int. Cl.
*G02F 1/1339*  (2006.01)
*H01L 21/285*  (2006.01)
(Continued)

(52) U.S. Cl.
CPC ........ *G02F 1/13394* (2013.01); *G02F 1/1368* (2013.01); *G02F 1/136227* (2013.01);
(Continued)

(58) Field of Classification Search
None
See application file for complete search history.

(56) References Cited

U.S. PATENT DOCUMENTS

| 7,570,338 B2 | 8/2009 | Yoon et al. |
| 2010/0225608 A1* | 9/2010 | Zhou ................... G02F 1/13338 345/173 |

FOREIGN PATENT DOCUMENTS

| CN | 1881015 A | 12/2006 |
| CN | 202033558 U | 11/2011 |

(Continued)

OTHER PUBLICATIONS

International Search Report of PCT/CN2015/076293 in Chinese, dated Jun. 19, 2015 with English translation.
(Continued)

*Primary Examiner* — Daniel Whalen
(74) *Attorney, Agent, or Firm* — Collard & Roe, P.C.

(57) ABSTRACT

An array substrate, a display panel and a display apparatus are disclosed. The array substrate includes a plurality of gate lines (10; 50) and a plurality of data lines (30; 51), and pixel units arranged in an array. Each of the pixel units includes one pixel electrode (41; 42) and one thin film transistor, the data line (30; 51) serve as a source electrode (31; 311) of the thin film transistor, the gate line (10; 50) serve as a gate electrode (11) of the thin film transistor, and a drain electrode (32; 321; 322) of the thin film transistor is electrically connected to the pixel electrode (41; 42), at least one of the gate lines (10; 50) and the data lines (30; 51) has a recess (363; 364) provided thereon aligned with a spacer for fixing. With the recess (363; 364), the post spacer is prevented from moving to affect the display region when the substrate is bent and deformed under an external pressure.

17 Claims, 4 Drawing Sheets

(51) Int. Cl.
  *G02F 1/1362* (2006.01)
  *G02F 1/1368* (2006.01)
  *H01L 21/02* (2006.01)
  *H01L 27/12* (2006.01)
  *H01L 29/49* (2006.01)
  *H01L 29/51* (2006.01)
  *G02F 1/1343* (2006.01)

(52) U.S. Cl.
  CPC .... *G02F 1/136286* (2013.01); *H01L 21/0217* (2013.01); *H01L 21/0262* (2013.01); *H01L 21/02274* (2013.01); *H01L 21/02532* (2013.01); *H01L 21/02565* (2013.01); *H01L 21/02592* (2013.01); *H01L 21/02631* (2013.01); *H01L 21/2855* (2013.01); *H01L 27/124* (2013.01); *H01L 27/1222* (2013.01); *H01L 27/1225* (2013.01); *H01L 27/1259* (2013.01); *H01L 29/4908* (2013.01); *H01L 29/4966* (2013.01); *H01L 29/518* (2013.01); *G02F 2001/134345* (2013.01)

(56) References Cited

FOREIGN PATENT DOCUMENTS

| | | |
|---|---|---|
| CN | 102629581 A | 8/2012 |
| CN | 102707504 A | 10/2012 |
| CN | 203069938 U | 7/2013 |
| CN | 103869548 A | 6/2014 |
| CN | 104035239 A | 9/2014 |
| CN | 204101855 U | 1/2015 |
| KR | 10-2006-0000282 A | 1/2006 |

OTHER PUBLICATIONS

Notice of Transmittal of the International Search Report of PCT/CN2015/076293 in Chinese, dated Jun. 19, 2015.

Written Opinion of the International Searching Authority of PCT/CN2015/076293 in Chinese, dated Jun. 19, 2015 with English translation.

* cited by examiner

ARRAY SUBSTRATE, DISPLAY PANEL AND DISPLAY APPARATUS HAVING RECESSES ON DATA LINES OR GATE LINES

CROSS REFERENCE TO RELATED APPLICATIONS

This application is the National Stage of PCT/CN2015/076293 filed on Apr. 10, 2015, which claims priority under 35 U.S.C. § 119 of Chinese Application No. 201420628360.1 filed on Oct. 27, 2014, the disclosure of which is incorporated by reference.

TECHNICAL FIELD

Embodiments of the present invention relate to an array substrate, a display panel and a display apparatus.

BACKGROUND

Currently, the liquid crystal display technology has been widely applied to televisions, cell phones and display of public information, and is a widely used display technology. A liquid crystal display panel of a liquid crystal display includes a counter substrate and an array substrate that are disposed in opposition, as well as a liquid crystal layer located between the two substrates. In addition, in order to guarantee the stability of thickness of the liquid crystal layer, Post Spacers (PSs) playing a supporting role are also provided between the two substrates in general. The PSs are usually fixed on the array substrate, and the design of PSs affects the uniformity of thickness of the liquid crystal layer, and then affects the quality of liquid crystal display.

SUMMARY

According to embodiments of the invention, there are provided an array substrate, a display panel and a display apparatus. By means of providing a recess on a gate line and/or a data line of the array substrate, when a counter substrate and the array substrate are cell-aligned, the recess and a post spacer are fixed and disposed opposite to each other (i.e. the recess and a post spacer are aligned for fixing). This can guarantee the uniformity and stability of thickness of a liquid crystal layer, and at the same time, the post spacer is prevented from moving to affect the display region when the substrate is bent and deformed under an external pressure.

An array substrate provided by at least one embodiment of the present invention includes a plurality of gate lines and a plurality of data lines, pixel units that are provided on the array substrate and arranged in an array, wherein each of the pixel units includes a pixel electrode and a thin film transistor, one of the data lines serves as a source electrode of the thin film transistor, one of the gate lines serves as a gate electrode of the thin film transistor, and a drain electrode of the thin film transistor is electrically connected to the pixel electrode, a recess configured for fixing a spacer and disposed opposite to the spacer (i.e. a recess aligned with a spacer for fixing) is provided on at least one of the gate line and the data line.

A display panel provided by embodiments of the invention includes the array substrate as stated in the above embodiment of the invention.

A display apparatus provided by embodiments of the invention includes the display panel as stated in the above embodiment of the invention.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

Figure 1:
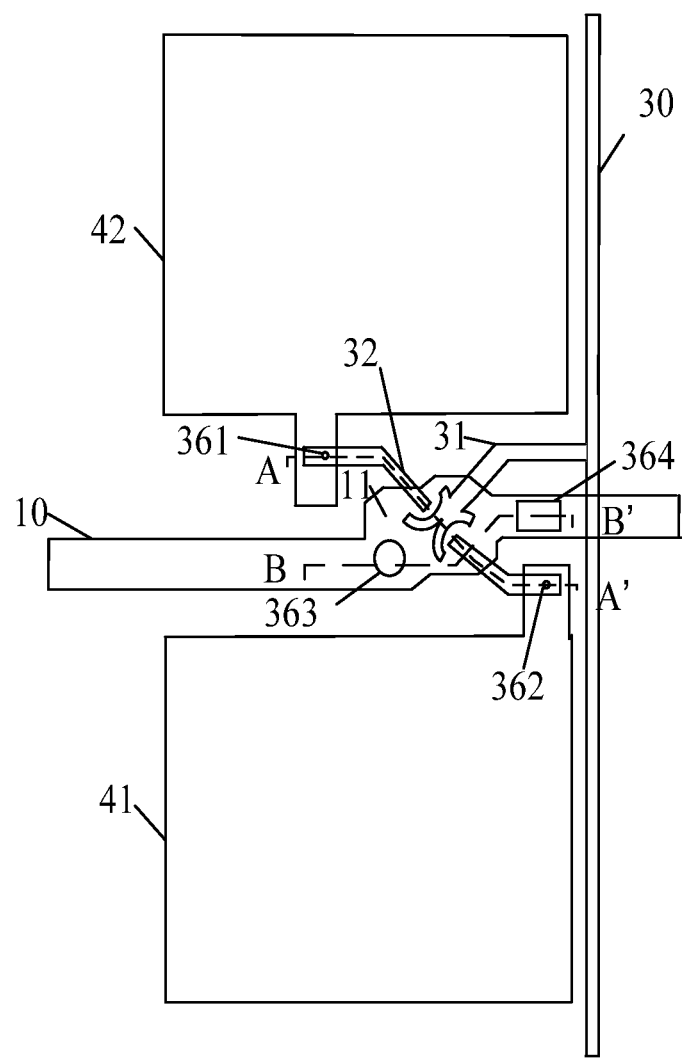
FIG. 1 is a structurally schematic view illustrating an array substrate provided by an embodiment of the present invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Thicknesses of film layers and size and shape of regions in the attached drawings do not reflect the true scale of components of an array substrate, and are merely aimed to exemplarily illustrate contents of the invention.

In a study, as noticed by inventor(s) of the present application, PSs are generally provided in a region corresponding to a black matrix on a counter substrate, and for the sake of simplifying the manufacturing process, heights of PSs provided on the counter substrate are usually equal to each other. Then, after the counter substrate and an array substrate is cell-aligned, PSs provided between the two substrates contact with both the two substrates, so as to provide a supporting force, and to guarantee the uniformity and stability of thickness of a liquid crystal layer. However, with this structure, when the liquid crystal panel is bent and deformed under a stronger external pressure exerted on it, a movement of PSs may affect a display region, and then affect display of the liquid crystal display.

An array substrate provided by an embodiment of the invention, includes a plurality of gate lines, a plurality of data lines, and pixel units that are provided on the array substrate and arranged in an array. Each of the pixel units includes a pixel electrode and a thin film transistor, a data line directly serves as a source electrode of the thin film transistor, a gate line directly serves as a gate electrode of the thin film transistor, a drain electrode of the thin film transistor is electrically connected to the pixel electrode, and a recess configured for fixing a spacer and disposed opposite to the spacer is provided on the gate line and/or the data line.

In embodiments of the invention, a drain electrode of the thin film transistor and the pixel electrode may be electrically connected through a via hole. But embodiments of the invention are not limited to this, and for example, a pixel electrode may be directly taped to a drain electrode of a thin film transistor.

Additionally, the spacer in embodiments of the invention may be a post spacer, and may also be a pacer of other shape, as long as a recess configured for fixing it and disposed opposite to it can be provided on the array substrate. In the following embodiments, a post spacer will be described as an example.

In the case that no recess configured for fixing a spacer and disposed opposite to the spacer is provided on an array substrate, an end of the spacer is fixed on a counter substrate, and the end of the spacer close to the array substrate is not fixed. In embodiments of the invention, with the aid of provision of a recess configured for fixing a spacer and disposed opposite to the spacer (namely, the recess and the spacer are disposed in opposition and the recess is useful for fixing the spacer), it can be achieved that, at least in a direction parallel to the plane in which the array substrate lies, the position of the end of the spacer close to the array substrate relative to the array substrate is fixed.

In the array substrate provided by embodiments of the invention, by means of providing a recess on a gate line and/or a data line of the array substrate, the recess and a post spacer are fixed and disposed opposite to each other when a counter substrate and the array substrate are cell-aligned, and thus the spacing between the counter substrate and the array substrate is longitudinally fixed and laterally fixed. This can guarantee the uniformity and stability of thickness of a liquid crystal layer, and at the same time, the post spacer is prevented from moving to affect the display region when the substrate is bent and deformed under an external pressure.

In an array substrate provided by embodiments of the invention, the structure of the array substrate is shown in FIG. 1. As an example, consider the following: a pixel unit including a pixel electrode 42 is a first pixel unit, and a pixel unit including a pixel electrode 41 is a second pixel unit. In the first pixel unit, a thin film transistor is provided at the intersection point of the gate line 10 and the data line 30, the gate electrode 11 of the thin film transistor and the gate line 10 are formed integrally, the source electrode 31 of the thin film transistor and the data line 30 are formed integrally, and a drain electrode 32 is electrically connected to the pixel electrode 42 through a via hole 361; in the second pixel unit, a thin film transistor is provided at the intersection point of the gate line 10 and the data line 30, the gate electrode 11 of the thin film transistor and the gate line 10 are formed integrally, the source electrode 31 of the thin film transistor and the data line 30 are formed integrally, and a drain electrode is electrically connected to the pixel electrode 41 through a via hole 362. The first pixel unit and the second pixel unit share the source electrode 31, and the structure of the source electrode 31 may be the structure shown in FIG. 1.

Figure 2:
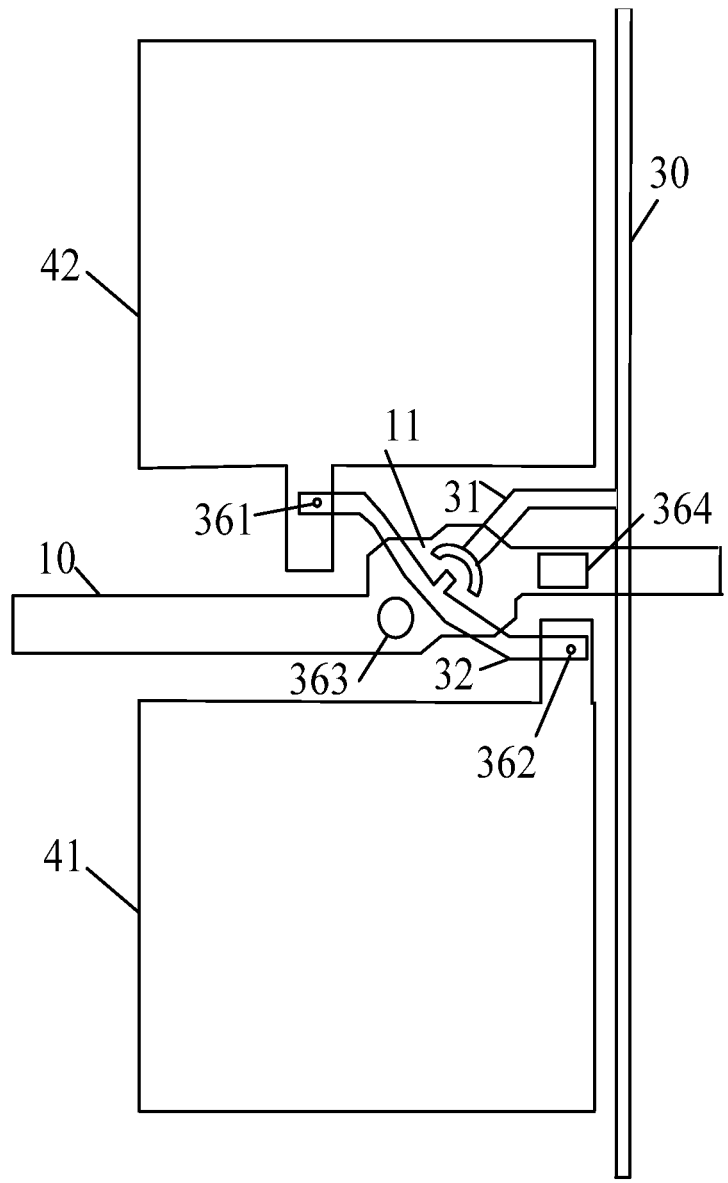
FIG. 2 is a structurally schematic view illustrating another array substrate provided by an embodiment of the invention.

According to the array substrates provided by embodiments of the invention, the structure of another array substrate is shown in FIG. 2. As an example, consider the following: a pixel unit including a pixel electrode 42 is a first pixel unit, and a pixel unit including a pixel electrode 41 is a second pixel unit. In the first pixel unit, a thin film transistor is provided at the intersection point of the gate line 10 and the data line 30, the gate electrode 11 of the thin film transistor and the gate line 10 are formed integrally, the source electrode 31 of the thin film transistor and the data line 30 are formed integrally, and a drain electrode 32 is electrically connected to the pixel electrode 42 through a via hole 361; in the second pixel unit, a thin film transistor is provided at the intersection point of the gate line 10 and the data line 30, the gate electrode 11 of the thin film transistor and the gate line 10 are formed integrally, the source electrode 31 of the thin film transistor and the data line 30 are formed integrally, and a drain electrode is electrically connected to the pixel electrode 41 through a via hole 362. The first pixel unit and the second pixel unit share the source electrode 31, and the structure of the source electrode 31 may be the structure shown in FIG. 2.

It is worth noting that, structure of a source electrode 31 may be the structure shown in FIG. 1, and may also be the structure shown in FIG. 2. Of course, it should be understood by those skilled in the art that, regarding the structure of a source electrode 31, there may also be other structures, and they are not used to make specific limitations herein.

In a possible embodiment, in an array substrate provided by embodiments of the invention, at least two recesses are provided on a gate line and/or a data line, namely, at least two recesses are provided on the gate line or the data line, or total number of the recesses provided on the gate line and the data line is at least two.

In a possible embodiment, in an array substrate provided by embodiments of the invention, the at least two recesses are two recesses, which are provided on the gate line.

In a possible embodiment, in an array substrate provided by embodiments of the invention, the at least two recesses are two recesses, one is provided on the gate line, and the other one is provided on the data line.

In an array substrate provided by embodiments of the invention, a recess is provided on a gate line, and likewise, a recess may also be provided on a data line.

In an embodiment of the invention, the at least two recesses are two recesses, namely, referring to FIG. 1 and FIG. 2, a circular recess 363 and a rectangular recess 364 are provided on the gate line 10 between the first pixel unit and the second pixel unit, but it needs to be explained that, corresponding position and number of recesses may be set according to setting requirements for the PS position.

Upon concrete implementation, as shown in FIG. 1 or FIG. 2, a recess 363 and a recess 364 are provided on the gate line 10, and a recess 363 and a recess 364 are provided directly above the gate line 10. Certainly, the two recesses may also be provided on the data line 30 simultaneously, and it is also possible that, one is provided on a gate line 10, and the other is provided on a data line.

It is to be noted that, recesses (the recess 363 and the recess 364) provided on the gate line 10 may be formed synchronously with via holes (a via hole 361 and a via hole 362). In this way, an additional mask is not required, and the original manufacturing process flow of an array substrate may be used, without additionally increasing the equipment cost.

In a possible embodiment, in an array substrate provided by embodiments of the invention, the recesses include a circular recess and/or a rectangular recess. It is to be noted that, the shape of the recesses includes but is not limited to a circular shape, and a polygonal shape (e.g. a rectangular shape), as long as the recess can fix a PS and is disposed opposite to the PS.

In a possible embodiment, in an array substrate provided by embodiments of the invention, the two recesses have different depths, so as to facilitate discrimination between primary and secondary PSs when the recesses and the PSs are fixed and disposed opposition to each other. For example, a depth of a recess for fixing the primary PS is smaller, that is, shallower; and a depth of a recess for fixing the secondary PS is bigger, that is, deeper.

Upon specific implementation, difference in depth of recesses may be achieved by gray-level exposure, and difference in depth of recesses may also be achieved by laying a pixel electrode in one of two recesses. The pixel electrode may be provided in one layer or multiple layers, so as to change depth of the recess.

Figure 3:
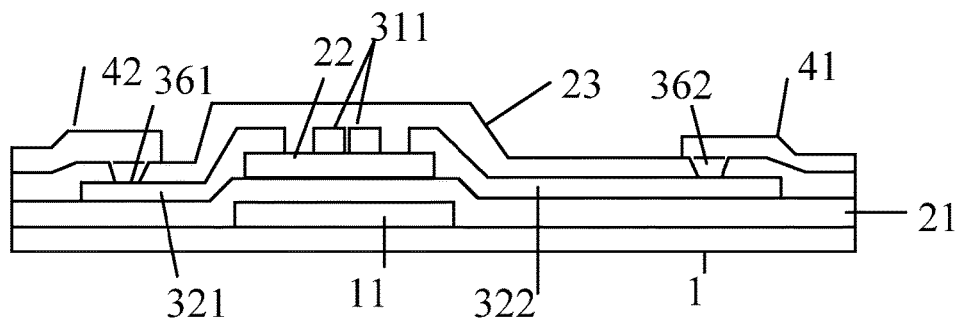
FIG. 3 is a structurally schematic view illustrating a cross section taken along A-A' of the array substrate structure shown in FIG. 1 provided by an embodiment of the invention.
Figure 4:
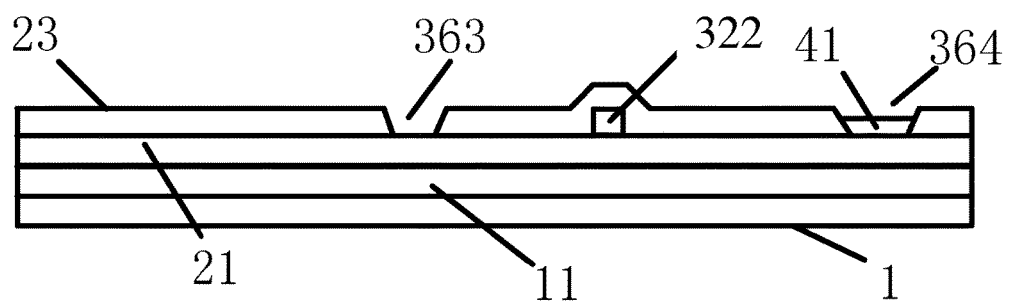
FIG. 4 is a structurally schematic view illustrating a cross section taken along B-B' of the array substrate structure shown in FIG. 1 provided by an embodiment of the invention.

Hereinafter, with the array substrate structure shown in FIG. 1 as an example, the fabrication process for it will be described in detail in combination with FIG. 3 and FIG. 4. Its fabrication process, for example, includes the following steps 1 to 6.

Step 1, a metal layer (e.g. of aluminum (Al)) is deposited by sputtering onto a base substrate 1 of an array substrate, and coating a photoresist, exposure, development and etching are conducted respectively, so as to form a pattern of a gate line, a gate electrode 11 and a common electrode line.

Step 2, a gate insulating layer 21 is deposited by using a Plasma Enhanced Chemical Vapor Deposition (PECVD) method, and the material used comprises such as silicon nitride.

Step 3, a semiconductor layer is deposited, for example, amorphous silicon (a-Si) is deposited by PECVD or an Indium Gallium Zinc Oxide (IGZO) is deposited by sputtering; coating a photoresist, exposure, development and etching are conducted, so as to form pattern of an active layer 22.

Step 4, depositing a metal layer (e.g. of aluminum (Al)) by sputtering, coating a photoresist, exposure, development and etching are conducted, so as to form a pattern of a data line, a source electrode 311, a drain electrode 321 and a drain electrode 322; wherein, the active layer 22 is located below the source electrode 311, the drain electrode 321 and the drain electrode 322, and located above the gate insulating layer 21.

Step 5, a passivation layer 23 is deposited, for example, silicon nitride is deposited by PECVD or a resin layer is coated; coating a photoresist, exposure, development and etching are conducted, so as to form a via hole 361 and a via hole 362; the drain electrode 321 of a thin film transistor is exposed by the via hole 361, and the drain electrode 322 of a thin film transistor is exposed by the via hole 362; while the via hole 361 and the via hole 362 are formed, a recess 363 and a recess 364 are also formed, and the position of the recess 363 and the recess 364 may be on a gate line and/or a data line.

Step 6, sputtering a conductive material layer of a transparent metal oxide (e.g. Indium Tin Oxide (ITO), which is an N-type oxide semiconductor), coating a photoresist, exposure, development and etching are conducted, so as to form a pixel electrode 41 and a pixel electrode 42; wherein, the pixel electrode 42 is electrically connected to the drain electrode 321 of the thin film transistor through the via hole 361, the pixel electrode 41 is electrically connected to the drain electrode 322 of the thin film transistor through the via hole 362; and a layer of pixel electrode 41 may be provided in the recess 363 or the recess 364. For example, as shown in FIG. 4, a layer of pixel electrode 41 is provided in the recess 364, so as to change the depth of the recess, and this is aimed to make discrimination between the primary PS and the secondary PS when recesses and PSs are fixed and disposed opposite to each other.

It is worth noting that, in embodiments of the invention, the gate line and the data line may be fabricated by using a metallic material such as copper (Cu), aluminum (Al), molybdenum (Mo), titanium (Ti), chromium (Cr), tungsten (W) or the like, and may also be fabricated by using an alloy of these materials; the gate line may be a single-layered structure, and may also adopt a multilayered structure, such as, Mo\Al\Mo, Ti\Cu\Ti, Mo\Ti\Cu. The gate insulating layer 21 may adopt silicon nitride or silicon oxide; the gate insulating layer 21 may be a single-layered structure, and may also be a multilayered structure, such as silicon oxide/silicon nitride. The active layer 22 may adopt amorphous silicon, or an oxide semiconductor. The passivation layer 23 may adopt an inorganic substance, such as silicon nitride, and may also adopt an organic substance, such as resin; the pixel electrode 41 and the pixel electrode 42 are fabricated by using a transparent conductive oxide indium zinc oxide (IZO), ITO or other transparent metal oxide conductive material.

Figure 5:
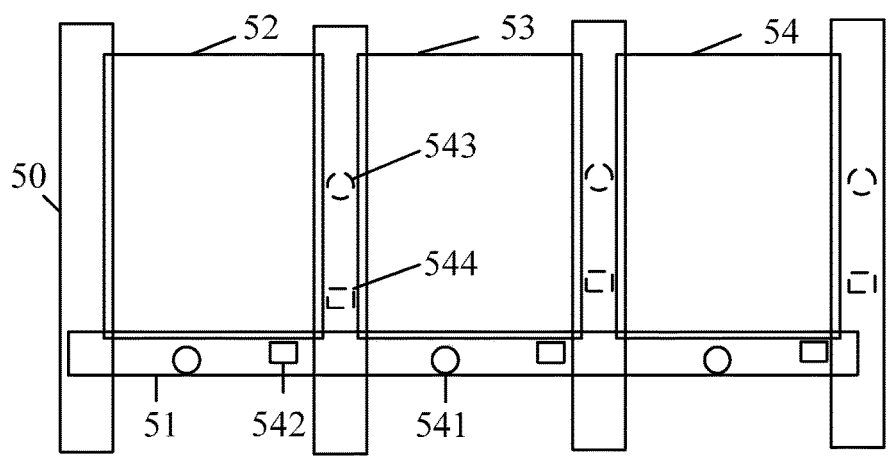
FIG. 5 is a schematic view illustrating the planar structure of an array substrate provided by an embodiment of the invention.

The planar graph of manufacturing a complete array substrate is shown in FIG. 5, in which, a Black Matrix (BM) resin is coated on a gate line 50 and data line 51, and a recess 541 and a recess 542 are provided on the gate line 50. Of course, a recess 543 and a recess 544 may also be provided on the data line 51, red (R), green (G) and blue (B) resins (R resin 52, G resin 53, B resin 54) may be produced on the array substrate to be integrated with array circuits, and may also be produced on a counter substrate.

A display panel provided by embodiments of the invention includes the array substrate as stated in any of embodiments of the invention.

Figure 6:
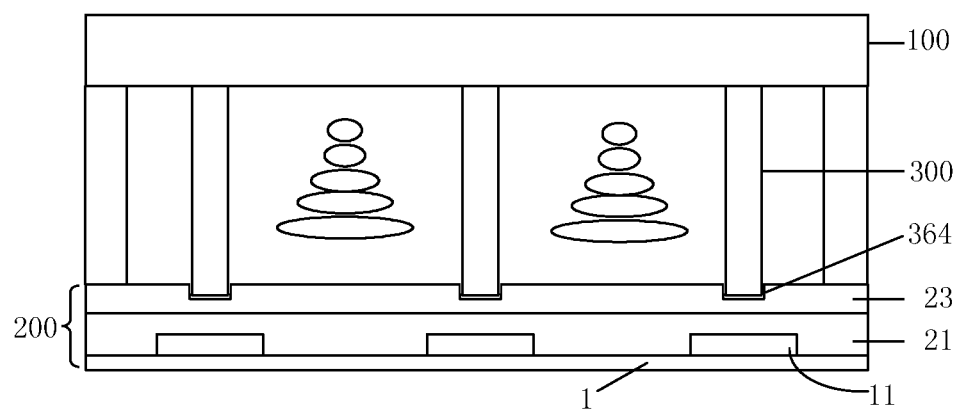
FIG. 6 is a schematic view illustrating the sectional structure of a display panel provided by an embodiment of the invention.

As shown in FIG. 6, for example, the display panel includes a counter substrate 100 and an array substrate 200 that are coupled in a sealing way with a sealant, and a liquid crystal layer and post spacers 300 configured for maintaining the cell thickness are provided between the counter substrate 100 and the array substrate 200. For example, a gate insulating layer 21 and a passivation layer 23 are sequentially arranged on a gate line 11 in the array substrate, and recesses 364 are provided at a location corresponding to the gate line 11 in the passivation layer 23, the recesses 364 being configured for fixing the post spacers 300 and disposed opposite to the post spacer 300. It is to be noted that, only partial structures of the display panel is shown in FIG. 6.

In the display panel provided by embodiments of the invention, by means of providing a recess on a gate line and/or a data line of an array substrate, the recess and a post spacer are fixed and disposed opposite to each other when a counter substrate and the array substrate are cell-aligned, and thus the spacing between the counter substrate and the array substrate is longitudinally fixed and laterally fixed. This can guarantee the uniformity and stability of thickness of a liquid crystal layer, and at the same time, the post spacer is prevented from moving to affect the display region when the substrate is bent and deformed under an external pressure.

A display apparatus provided by embodiments of the invention includes the display panel as stated in an embodiment of the invention.

In the above display apparatus provided by embodiments of the invention, by means of providing a recess on a gate line and/or a data line of an array substrate in the display panel, the recess and a post spacer are fixed and disposed opposite to each other when a counter substrate and the array substrate are cell-aligned, and thus the spacing between the counter substrate and the array substrate is longitudinally fixed and laterally fixed. When the recess and the post spacer are fixed and disposed opposite to each other, the uniformity and stability of thickness of a liquid crystal layer are ensured, at the same time, the post spacer is prevented from moving to has an impact on a display region when the substrate is bent and deformed under an external pressure, as compared to the case that no recess is provided on a gate line and/or a data line.

In a possible embodiment, in the display apparatus provided by embodiments of the invention, the display apparatus is a liquid crystal display apparatus.

The display apparatus provided by embodiments of the invention may be an electronic paper, an OLED panel, a cell phone, a tablet computer, a television, a display, a notebook computer, a digital photo frame, a navigator or any other product or component having a display function.

An array substrate, a display panel and a display apparatus are provided by embodiments of the invention. By means of providing a recess on a gate line and/or a data line of the array substrate, the recess and a post spacer are fixed and disposed opposite to each other when a counter substrate and the array substrate are cell-aligned, and thus the spacing between the counter substrate and the array substrate is longitudinally fixed and laterally fixed. This can guarantee the uniformity and stability of thickness of a liquid crystal layer, and at the same time, the post spacer is prevented from moving to affect the display region when the substrate is bent and deformed under an external pressure.

The descriptions made above are merely exemplary embodiments of the invention, but are not used to limit the protection scope of the invention. The protection scope of the invention is defined by attached claims.

This application claims the benefit of priority from Chinese patent application No. 201420628360.1, filed on Oct. 27, 2014, the disclosure of which is incorporated herein in its entirety by reference as a part of the present application.

What is claimed is:

1. An array substrate, comprising: a plurality of gate lines and a plurality of data lines, pixel units that are provided on the array substrate and arranged in an array, wherein,
    each of the pixel units includes a pixel electrode and a thin film transistor, one of the data lines serves as a source electrode of the thin film transistor, one of the gate lines serves as a gate electrode of the thin film transistor, a drain electrode of the thin film transistor is electrically connected to the pixel electrode, and
    at least two recesses each configured for fixing a spacer and disposed opposite to the spacer are provided on one of the data lines or one of the gate lines, and the at least two recesses have different kinds of shapes in a plane parallel to the array substrate.

2. The array substrate according to claim 1, wherein the at least two recesses include a circular recess and/or a rectangular recess.

3. The array substrate according to claim 1, wherein the at least two recesses include a polygonal recess.

4. The array substrate according to claim 1, wherein one of the two recesses is provided with a conductive layer therein, which is formed in the same layer as the pixel electrode and is spaced apart from the pixel electrode.

5. The array substrate according to claim 1, wherein the drain electrode is electrically connected to the pixel electrode through a via hole, or the pixel electrode is directly taped to the drain electrode.

6. The array substrate according to claim 5, wherein the drain electrode is electrically connected to the pixel electrode through the via hole; the at least two recesses and the via hole are in a same layer.

7. A display panel, comprising the array substrate according to claim 1.

8. A display apparatus, comprising the display panel according to claim 7.

9. The display apparatus according to claim 8, wherein, the display apparatus is a liquid crystal display apparatus.

10. The array substrate according to claim 1, wherein the at least two recesses have different depths.

11. An array substrate, comprising: a plurality of gate lines and a plurality of data lines, pixel units that are provided on the array substrate and arranged in an array, wherein,
    each of the pixel units includes a pixel electrode and a thin film transistor, one of the data lines serves as a source electrode of the thin film transistor, one of the gate lines serves as a gate electrode of the thin film transistor, a drain electrode of the thin film transistor is electrically connected to the pixel electrode, and
    at least two recesses each configured for fixing a spacer and disposed opposite to the spacer are provided on one of the data lines or one of the gate lines, the at least two recesses have different depths, and at least one of the at least two recesses has an insulating surface, directly on which the spacer is to be disposed.

12. The array substrate according to claim 11, wherein the at least two recesses include a circular recess and/or a rectangular recess.

13. The array substrate according to claim 11, wherein the at least two recesses include a polygonal recess.

14. The array substrate according to claim 11, wherein one of the at least two recesses is provided with a conductive layer therein, which is formed in the same layer as the pixel electrode and is spaced apart from the pixel electrode.

15. The array substrate according to claim 11, wherein the drain electrode is electrically connected to the pixel electrode through a via hole, or the pixel electrode is directly taped to the drain electrode.

16. A display panel, comprising the array substrate according to claim 11.

17. A display apparatus, comprising the display panel according to claim 16.

* * * * *